US008136481B2

(12) United States Patent
Viol et al.

(10) Patent No.: US 8,136,481 B2
(45) Date of Patent: Mar. 20, 2012

(54) DEVICE FOR PLASMA TREATMENT AT ATMOSPHERIC PRESSURE

(75) Inventors: Wolfgang Viol, Adelebsen (DE); Stefan Born, Gottingen (DE); Andy Kaemling, Birkenfelde (DE)

(73) Assignee: Fachhochschule Hildesheim/Holzminden/Goettingen, Hildesheim (DE)

( * ) Notice: Subject to any disclaimer, the term of this patent is extended or adjusted under 35 U.S.C. 154(b) by 832 days.

(21) Appl. No.: 12/207,585

(22) Filed: Sep. 10, 2008

(65) Prior Publication Data

US 2009/0009090 A1 Jan. 8, 2009

Related U.S. Application Data

(63) Continuation of application No. PCT/EP2007/002143, filed on Mar. 12, 2007.

(30) Foreign Application Priority Data

Mar. 11, 2006 (DE) ......................... 10 2006 011 312

(51) Int. Cl.
*C23C 16/00* (2006.01)

(52) U.S. Cl. .................................................. 118/723 E

(58) Field of Classification Search .................. 118/715, 118/722, 723 R, 723 E; 156/345.43, 345.44, 156/345.45, 345.46, 345.47; 315/111.21
See application file for complete search history.

(56) References Cited

U.S. PATENT DOCUMENTS

| | | | | |
|---|---|---|---|---|
| 5,603,893 | A | 2/1997 | Gundersen et al. | |
| 6,489,585 | B1 | 12/2002 | Nakamura et al. | |
| 2001/0020582 | A1 | 9/2001 | Barankova et al. | |
| 2002/0092616 | A1 | 7/2002 | Kim | |
| 2006/0084158 | A1 | 4/2006 | Viol | |
| 2006/0234472 | A1 | 10/2006 | Gabriel | |
| 2006/0239873 | A1 * | 10/2006 | Niv et al. | 422/186.04 |

FOREIGN PATENT DOCUMENTS

| | | | |
|---|---|---|---|
| DE | 197 17 698 | A1 | 10/1998 |
| DE | 199 57 775 | C1 | 7/2000 |
| DE | 103 24 926 | B3 | 2/2005 |
| EP | 1 073 091 | A | 1/2001 |
| JP | 2003-133291 | A | 5/2003 |
| WO | 1987-07248 | | 12/1987 |
| WO | 00/79843 | A1 | 12/2000 |
| WO | 02/065820 | | 8/2002 |
| WO | 2004-051729 | A2 | 6/2004 |
| WO | 2004-105810 | A | 12/2004 |

OTHER PUBLICATIONS

English Translation of PCT Search Report mailed Nov. 3, 2008 in co-pending related application No. PCT/EP20071002143. 6 Pages.

* cited by examiner

*Primary Examiner* — Maureen Gramaglia
(74) *Attorney, Agent, or Firm* — Thomas, Kayden, Horstemeyer & Risley, LLP

(57) ABSTRACT

A device (1) for plasma treatment comprises an electrode (2) having a surface (14) covered by a dielectric barrier (3), and an AC high voltage source (6) for applying an AC high voltage to the electrode (2) to bring about a dielectric barrier discharge (9) in a gas (10) at atmospheric pressure present in front of the dielectric barrier (3) in order to generate a plasma. To the end of generating the plasma even without a counter-electrode for the electrode (2), pointed tips are distributed over the surface (14) of the electrode (2), these pointed tips pointing towards the gas (10) in front of the dielectric barrier (3), whereas the dielectric barrier (3) has a smooth outer surface (15) facing the gas (10).

16 Claims, 4 Drawing Sheets

DEVICE FOR PLASMA TREATMENT AT ATMOSPHERIC PRESSURE

CROSS REFERENCE TO RELATED APPLICATIONS

This application is a continuation of International Patent Application PCT/EP2007/002143 entitled "Device for Plasma Treatment at Atmospheric Pressure", filed on Mar. 12, 2007, and claiming priority to German Patent Application No. DE 10 2006 011 312.8 entitled "Vorrichtung zur Plasmabehandlung unter Atmosphärendruck", filed Mar. 11, 2006, and granted as German patent DE 10 2006 011 312.

FIELD OF THE INVENTION

The invention generally relates to devices for plasma treatment at atmospheric pressure. More particular, the invention relates to devices for plasma treatment comprising an electrode, a dielectric barrier arranged directly in front of the electrode, and an AC high voltage source for applying an AC high voltage to the electrode to bring about a dielectric barrier gas discharge in a gas which is present in front of the dielectric barrier and which is at atmospheric pressure, in order to generate a plasma.

BACKGROUND OF THE INVENTION

It is known that a plasma treatment of surfaces increases the adhesiveness of various materials during a subsequent coating, like for example a subsequent lacquering.

German patent publication DE 199 57 775 C1 discloses a device for plasma treatment of wood, wherein the wood is earthed to serve as a counter-electrode for the electrode having the dielectric barrier, to which the AC high voltage is applied.

From international patent application publication WO 2004/105810 A1 is it known to treat biologic materials containing living cells with a plasma. Here, the gas discharge is ignited between the electrode with the dielectric barrier and the biologic material by means of an AC high voltage applied to the electrode, wherein the biologic material serves as a capacitive counter-electrode for the electrode with the dielectric barrier. The electrode comprising the dielectric barrier which covers the electrode has a tapering shape. The device known from WO 20041105810 A1 is provided as a battery- or accumulator-powered, hand-held unit, its AC high voltage source being based on semiconductor technology.

If a plasma for a surface treatment is generated by means of a dielectric barrier discharge at atmospheric pressure, this is up to now always done between an electrode with a dielectric barrier and some kind of a counter-electrode which is located at a certain distance to the electrode with the dielectric barrier, the gas in which the discharge is ignited being present between the electrode and the counter-electrode.

International patent application publication WO 87/07248 A1 discloses a device for treating objects using electric high voltage discharges in a gaseous media. Here, a unipolar AC high voltage is applied to an electrode which comprises a number of needle-shaped extensions extending in parallel to each other and embedded into a dielectric. Open channels run through the dielectric in parallel to the needle-shaped extensions, through which a spark discharge, i.e. no dielectric barrier discharge, extends up to the main part of the electrode. The electrode is arranged in front of the objects to be treated which are contacted electrically to provide a counter-electrode for the electrode.

International patent application publication WO 02/065820 A1 discloses a device for plasma treatment at atmospheric pressure, which has two opposing electrodes. One of the electrodes is earthed and provided with a dielectric barrier covering the electrode completely. A dielectric in front the other electrode which is connected to an AC high voltage source to apply an AC high voltage comprises open discharging gaps into which conductor electrodes extend from the other electrodes. The conductor electrodes are provides with pointed tips pointing towards the earthed electrode. Due to the concentration of the field strength of the electric field between the two electrodes at the pointed tips of the conductor electrodes, a gas discharge is ignited in a gas present between the two electrodes. This gas discharge is only dielectrically barred by the dielectric in front of the earthed electrode, as the dielectric in front of the electrode connected to the AC high voltage source comprises the open discharge gaps. The known device in constructed to introduce only gas in the space between the two electrodes. The plasma generated in the space between the electrodes may be used to treat surfaces located outside this space.

German patent application publication DE 197 17 698 A1 discloses a device for cleaning or activating electric circuit paths and surfaces of printed circuit boards. This device comprises a pair of opposing electrodes, at least one of which is provided with a dielectric barrier covering it completely. Emission tips which enhance the ignition of a gas discharge between the electrodes and homogenize the gas discharge are formed at the outer surface of one of the electrodes or of its dielectric barrier. The objects to be treated are introduced between the electrodes of the known device and may rest on one of the electrodes or its dielectric barrier. Preferably only the opposing electrode has emission tips. The emission tips may for example be made by etching the respective surface of a dielectric material. This results in radiuses of curvature of the tips of about 1 μm. Generally, the radiuses of curvature of the emission tips are between 10 nm and 0.5 mm. The needle- or pin-shaped emission tips may be provided in a surface density of between 1 and 100 per $cm^2$. Upon movement of the object to be treated into the space between the electrodes, there is a danger of contact of the object with the sharp emission tips extending into this space. Due to this contact the objects to be treated and/or the emission tips may be damaged.

The devices described up to here are only poorly or even not at all suited for treating materials which are poor or even no electric conductors, like for example plastics, glasses and stones or even dry wood, as these materials may not effectively serve as counter-electrodes for the electrode with the dielectric barrier.

Devices for generating potential-free plasmas in the form of a plasma beam, which are sometimes designated as plasma-jets or plasma-blasters, are commercially offered. Such devices base on a different principle than a dielectric barrier discharge. As rule, they need a power grid connection or, at least, a gas connection. Further, these devices are very expensive.

There is a need of a device for plasma treatment at atmospheric pressure which can be provided at low cost which has no sharp tips at an outer surface, and which nevertheless enables a plasma treatment of poorly or even not at all electrically conducting materials.

SUMMARY OF THE INVENTION

In a first aspect, the present invention relates to a device for plasma treatment at atmospheric pressure, the device having an electrode; a dielectric barrier directly arranged in front of the electrode and covering a surface of the electrode; and an AC high voltage source for applying an AC high voltage to the electrode to bring about a dielectric barrier discharge in a gas at atmospheric pressure present in front of an outer surface of the dielectric barrier, in order to generate a plasma; wherein the device has no counter-electrode for the electrode with the dielectric barrier; wherein the electrode, at the surface of the electrode covered by the dielectric barrier, comprises a two-dimensional distribution of pointed tips pointing towards the gas present in front of the dielectric barrier; and wherein the outer surface of the dielectric barrier in front of which the gas is present is smooth.

In a more detailed aspect, the present invention relates to a device for plasma treatment at atmospheric pressure, the device having an electrode; a dielectric barrier directly arranged in front of the electrode and covering a surface of the electrode; and a accumulator powered AC high voltage source for applying an AC high voltage to the electrode to bring about a dielectric barrier discharge in a gas at atmospheric pressure present in front of an outer surface of the dielectric barrier, in order to generate a plasma; wherein the AC high voltage source is designed so as to provide the AC high voltage as voltage pulse pairs of voltage pulses of alternating polarity at a repetition frequency of the voltage pulse pairs of less than 10,000 Hz and at a voltage amplitude of 5,000 volt to 60,000 volt; wherein the device has no counter-electrode for the electrode with the dielectric barrier; wherein the electrode, at the surface of the electrode covered by the dielectric barrier, comprises a two-dimensional distribution of pointed tips pointing towards the gas present in front of the dielectric barrier; wherein the outer surface of the dielectric barrier in front of which the gas is present is smooth; and wherein the electrode is made of an electrically conductive powder which is located in a ceramic solid body providing the dielectric barrier.

Surprisingly, it turns out that a dielectric barrier discharge can be brought about without any counter-electrode. Thus, the AC high voltage applied by the AC high voltage source to the electrode of the new device for plasma treatment at atmospheric pressure is able to ignite the plasma above any object to be treated independently of the electric properties of this object. Using the new device, it is even possible to ignite a plasma in a volume which is only delimited by gas in front of the dielectric barrier, i.e. without any counter-electrode behind the gas. This means that a dielectric barrier discharge is also brought about in a surrounding of gas only with the new device, the gas itself providing the necessary electrical capacitance. At least, there is a dark discharge at the surface of the dielectric barrier in a surrounding of gas only, which becomes a full barrier discharge generating the plasma when the new device is brought close to any surface to treat the surface to increase its adhesiveness prior to a coating, for example.

The electrode of the new device is a two-dimensional electrode, the AC high voltage applied to the electrode by the AC high voltage source sustaining the plasma over the surface of the two-dimensional electrode extending in to linearly independent directions. Particularly, the relevant surface of the two-dimensional electrode over which the gas discharge is brought about may be at least 2 $cm^2$. Preferably it is at least 4 $cm^2$, more preferably at least 8 $cm^2$. Nevertheless, the energy consumption of the device is kept within acceptable limits due to the dielectric barrier to the gas discharge.

The fact that the electrode of the new device is a two-dimensional electrode is in no contradiction to the fact that it comprises pointed tips, which are pointing towards the gas in front of the dielectric barrier. Instead, these pointed tips, i.e. small areas of the two-dimensional electrode having a small radius of curvature, are used to sustain the plasma even without a counter-electrode.

There are, however, no tips protruding from the outer surface of the new device; instead, the outer surface of the dielectric barrier of the electrode provided with the pointed tips is smooth. Thus, there is no danger of damaging a surface to be treated or of amending the electrical properties of the device due to a damage to its pointed tips.

Preferably, the pointed tips of the two-dimensional electrode have a radius of curvature of less than 100 μm, more preferably of less than 10.0 μm. The height of the pointed tips may, at the same time, be comparatively small and may be less than 2 mm, preferably less than 1 mm or even less than 0.5 mm. I.e. the pointed tips may be provided as a sharply roughed-up surface of the electrode. Here, the pointed tips are provided in a two-dimensional distribution, i.e. not only as a single row of needles arranged side by side. The surface density of the pointed tips may have an order of magnitude of 1 to 100,000 pointed tips per $cm^2$.

It is particularly easy to make the electrode of an electrically conductive powder which is arranged in a ceramic solid body providing the dielectric barrier. The powder as such provides a high number of suitable pointed tips.

A further important measure to enable the new device to ignite or sustain a plasma without any counter-electrode is that the AC high voltage applied by the AC high voltage source to the electrode comprises a steep voltage increase or rise of at least 5,000 volt/μs, preferably of at least 10,000 volt/μs. Particularly good results are obtained with a voltage rise of about 12,000 volt/μs.

Typically, the AC high voltage applied by the AC high voltage source to the electrode comprises voltage pulses display a voltage rise period of up to 5 μs, preferably of less than 3 μs, a pulse duration of less than 10 μs, preferably of less than 6 μs, and an amplitude of 5,000 volt to 60,000 volt, preferably of 5,000 volt to about 40,000 volt. These voltage pulses may have alternating polarity, i.e. be bipolar. Bipolar pulses are an advantage, however, they are not absolutely necessary.

A repetition frequency of the voltage pulses of the AC high voltage source may be smaller than 10,000 Hz. Preferably it is even smaller than 5,000 Hz; and particularly it may be in the range of 500 to 2,000 Hz. I.e. the repetition frequency of the voltage pulses is much smaller than the reciprocal value of the duration of the voltage pulses. In other words, the voltage pulses are comprised of bipolar pulse pairs or groups of voltage pulse pairs which are separated by pauses.

An AC high voltage source which is able to generate the AC high voltage described here may be manufactured in semiconductor technology using standard parts in compact dimensions. Thus, it is possible, to make the whole new device as a hand-held unit, which may even be battery- or accumulator-operated. Particularly, the new device may have the size of a commercially available cordless screwdriver. Thus, a very compact and portable hand-held unit is provided.

As the load capacitance may strongly vary with different objects arranged in front of the dielectric barrier in the new device, a controller for the AC high voltage is preferred which avoids an un-controlled increase of the output power of the device so that the device may for example not be misused as a so-called "taser". Such a controller may for example determine a feedback of a load capacitance to the input side of an ignition transformer of the AC high voltage source which is connected to the electrode at its output side, and use this information as an input value for controlling the output power of the AC high voltage source.

In this way the controller of the AC high voltage source is able to keep the output power of the AC high voltage source constant by varying the output voltage of the AC high voltage source and/or the pulse repetition rate of the voltage pulses of the AC high voltage.

Other features and advantages of the present invention will become apparent to one with skill in the art upon examination of the following drawings and the detailed description. It is intended that all such additional features and advantages be included herein within the scope of the present invention, as defined by the claims.

BRIEF DESCRIPTION OF THE DRAWINGS

The invention can be better understood with reference to the following drawings. The components in the drawings are not necessarily to scale, emphasis instead being placed upon clearly illustrating the principles of the present invention. In the drawings, like reference numerals designate corresponding parts throughout the several views.

DETAILED DESCRIPTION

Figure 1:
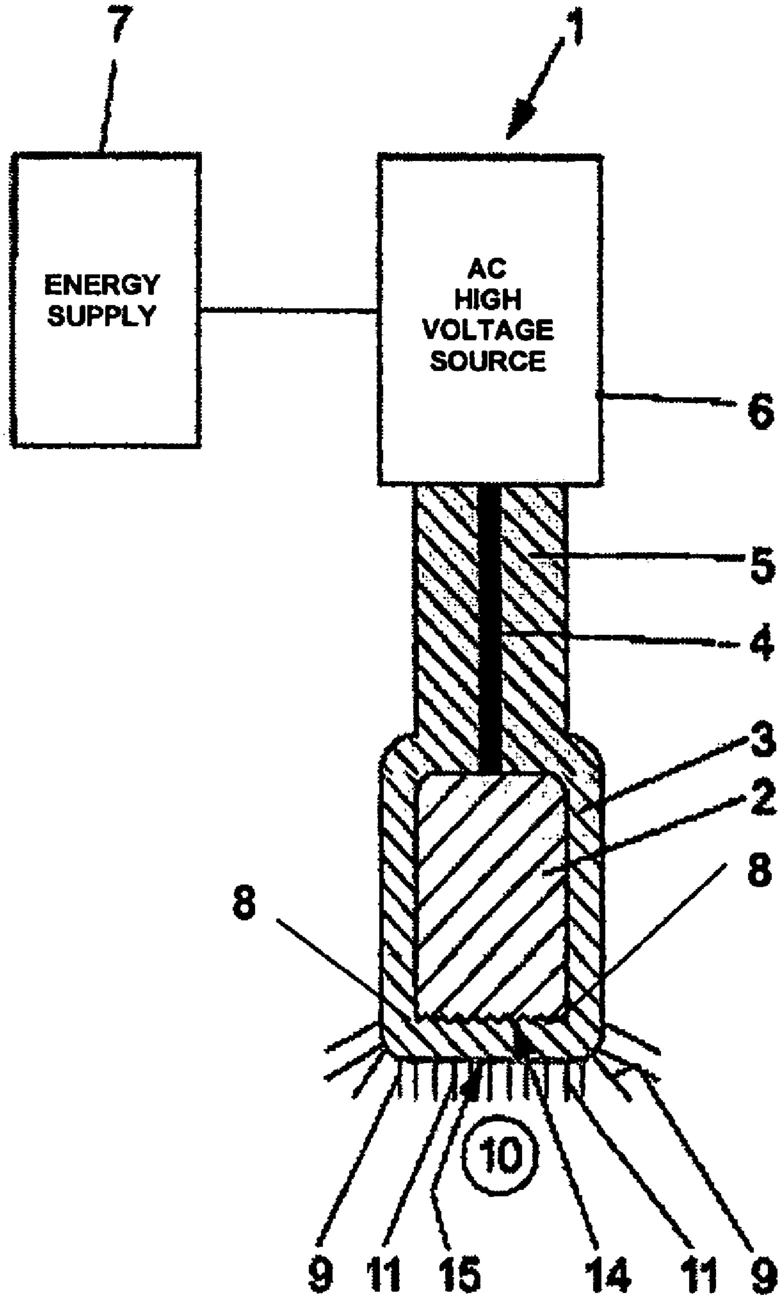
FIG. 1 shows the construction of a first embodiment of the new device for plasma treatment at atmospheric pressure, its electrode being depicted in a cross sectional view.

Referring now in greater detail to the drawings, FIG. 1 shows a device 1 for plasma treatment at atmospheric pressure of surfaces which are not depicted here. To this end, device 1 has an electrode 2 which is provided with a dielectric barrier 3 made of a suitable closed dielectric material, like for example a dense ceramic. A high voltage lead 4 having an electric isolation 5 connecting to dielectric barrier 3 leads to electrode 2. An AC high voltage is supplied to electrode 2 by an AC high voltage source 6 via high voltage lead 4. AC high voltage source 6 is based on semiconductor parts, and it is supplied with electric energy by an energy supply 7 which may be one or several batteries or accumulators or a mains adaptor. AC high voltage which will be more detailed explained with regard to FIG. 7 displays such a steep increase in voltage that a gas discharge 9 in the gas 10 at atmospheric pressure present in the surroundings of the electrode 2 is ignited and sustained over the complete front surface 14 of the device 1 even without the presence of a counter-electrode for the electrode 2. This is due to the fact that surface 14 of electrode 2 is made in such a way that it forms fine pointed tips with a radius of curvature of less than 100 μm, in the area of which the electric field and thus the change of the electric field due to the applied AC high voltage is focused or concentrated. This applies despite the flat, i.e. smooth outer surface 15 of dielectric barrier 3. Due to dielectric barrier 3, gas discharge 9 is a dielectric barrier discharge so that the energy output of the device 1 by means of the gas discharge is suitably limited. Gas discharge 9 results in a plasma 11 of reactive components, like for example radicals of gas 10, by means of which a surface can be activated for a successive coating to increase its adhesive properties, for example. As gas discharge 9 may be ignited with the device 1 even without a counter-electrode within the electrically relevant surroundings of the electrode 2, the plasma 11 may be generated with the device 1 independently of the electric conductivity of a surface to be treated and may be used for treating the surface.

Figure 2:
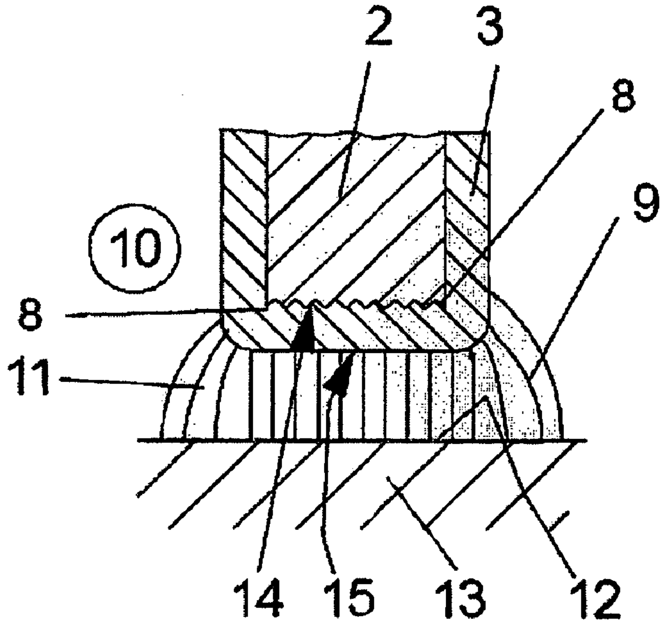
FIG. 2 shows the application of a plasma ignited by means of the device according to FIG. 1 to a poorly electrically conducting surface.

FIG. 2 illustrates the treatment of a surface 12 of a body 13 with the plasma 11. Due to the presence of the surface 12 in the surroundings of the electrode 2 the gas discharge and thus the plasma 11 are concentrated to the space between the electrode 2 and the surface 12, despite an only small electric conductivity of the material of the body 13.

Figure 3:
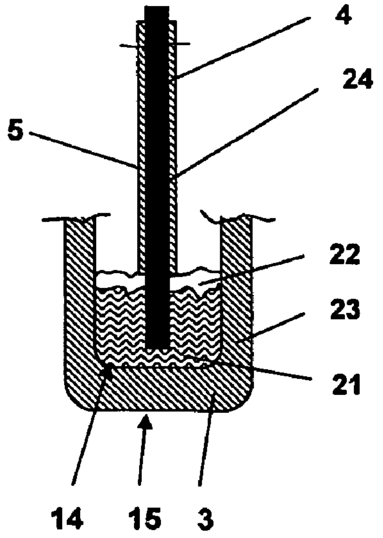
FIG. 3 shows a cross section through the front area of an electrode of a second embodiment of the device.

FIG. 3 illustrates an actual embodiment of the electrode 2 and its surface 14 provided with microscopic pointed tips. The material of the electrode 2 is sinter bronze in powder form which is also designated as bronze powder. The sinter bronze is simply poured into the dielectric barrier 3 made as a ceramic solid body 23, and a metal pin 24 forming the high voltage lead 4 is pressed into its center. At its back end, the area of the sinter bronze 21 is closed by an electrically isolating sealing mass 22. It is important in the new device to generate high field strengths in order to ignite a gas discharge over the dielectric barrier 3. The sinter bronze provides sufficient suitable pointed tips to this end. The electric conductivity of a powder forming the electrode 2 with the pointed tips at the surface 14 does not need to be particularly high.

Figure 4:
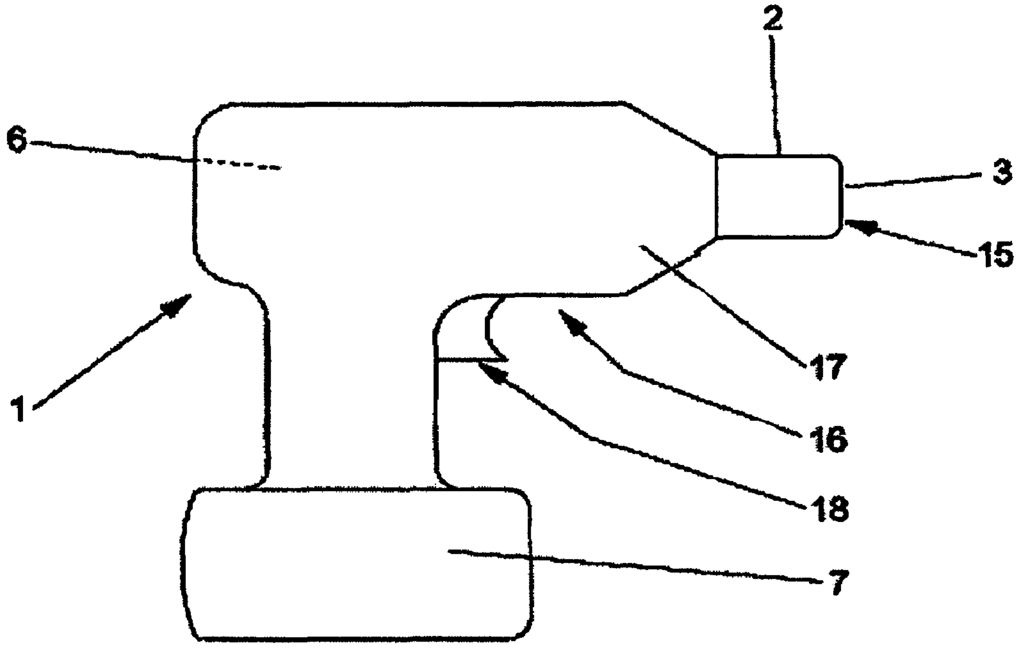
FIG. 4 sketches the construction of the new device as an accumulator-operated hand-held unit.

The new device 1 may be provided as a portable hand-held unit 16, like it is depicted in FIG. 4. Here, the energy supply 7 is an accumulator block, and the AC high voltage source 6 is provided within a casing 17 having a trigger-shaped operation switch 18. Upon pressing the operation switch 18 the AC high voltage is applied to the electrode 2, and, independently of whether a counter-electrode is present or not, a plasma is ignited in front of the outer surface 15 of the dielectric barrier 3 of the electrode 2 and sustained as long as the operation switch 18 is pressed.

Figure 5:
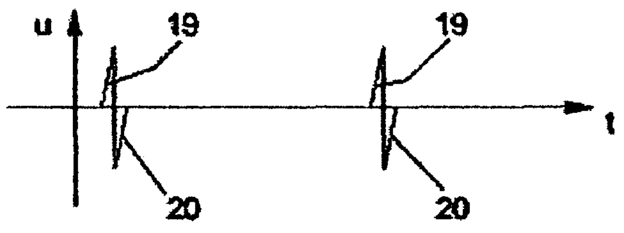
FIG. 5 shows the voltage curve of an AC high voltage applied to the electrode of the new device, which consists of bipolar voltage pulse pairs.

For igniting the plasma 11 even without a counter-electrode a sufficient steep voltage rise of the AC high voltage applied to the electrode 2 is important besides the structure of the surface of the electrode 2 and/or its dielectric barrier 3. To achieve this steep voltage rise, the AC high voltage may be made of voltage pulses 19 and 20 depicted in FIG. 5, each positive voltage pulse 19, which increases within few microseconds up to a voltage of 40,000 to 50,000 volt being directly followed by a negative voltage pulse 20, which approximately has the same course of the voltage over the time as the voltage pulse 19 but an opposite polarity. Then, a pause follows before a next pair of voltage pulses 19 and 20 is applied to the electrode 2. The fast voltage increase allows for igniting the gas discharge 9 independently of any counter-electrode, and the following very fast change of the polarity of the voltage allows for a successive back-ignition of the gas discharge, in which the previously separated charges of the gas serve as a kind of substitute for a counter-electrode. The intervals of the bipolar voltage pulse pairs 19, 20 may have an order of magnitude of 1 millisecond, without all free electrons of the plasma recombining in the meanwhile, so that the plasma may be built up again by the following voltage pulse pair starting from the remaining ionization.

Figure 6:
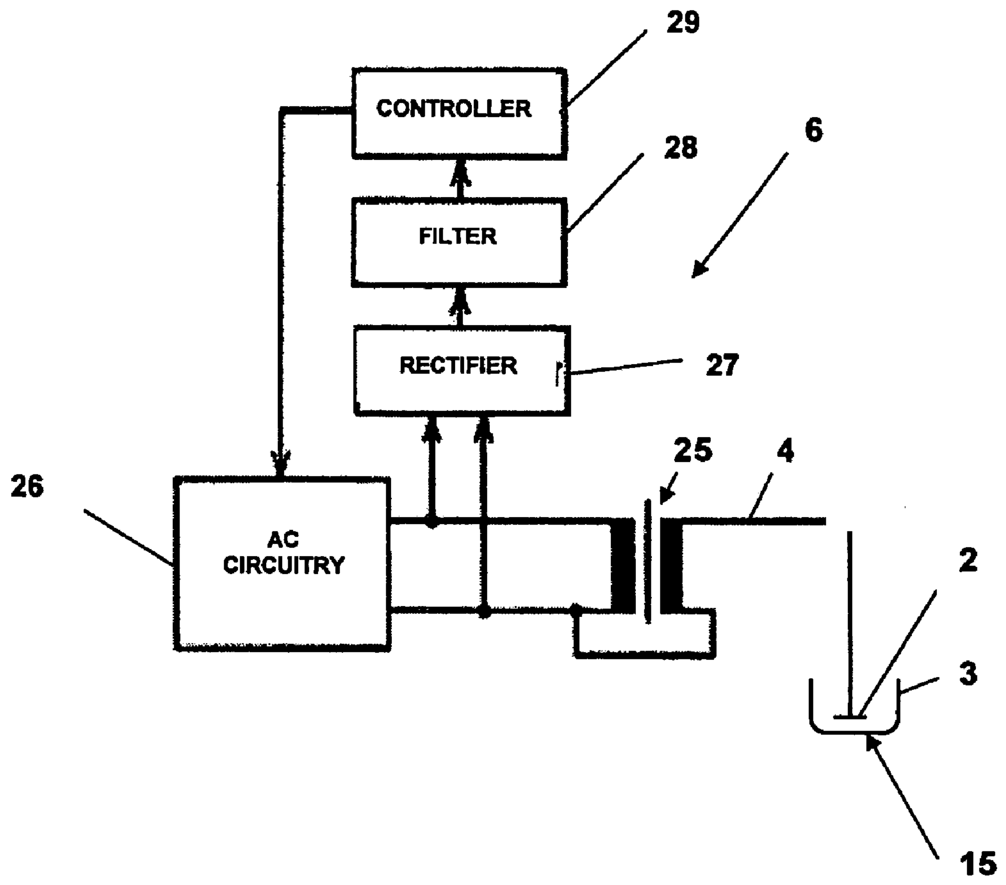
FIG. 6 shows the general construction of a controller for the AC high voltage applied to the electrode of the hand-held unit according to FIG. 4.

FIG. 6 shows the basic design of a preferred controller for the AC high voltage applied to the electrode of the hand-held unit 16 according to FIG. 4. An output load of an ignition transformer 25 which has an effect on the input side of an ignition transformer 25 is registered, i.e. measured, at the input side. This information is used as an input value for the controller for the output AC high voltage. The counter-induction of the secondary winding of the ignition transformer 25 is directed against the self-induction of its primary winding. The effect of the counter-induction of the secondary winding on the primary winding increases with the load on the secondary circuit. The amount of the voltage over the primary winding of the ignition transformer 25 thus decreases with increasing load at the output side or secondary winding. The voltage over the primary winding thus behaves exactly opposite to the load at the output side. This effect is used for controlling the ignition voltage. With high voltage generators according to the state of the art, the voltage amplitude is adjusted by means of a potentiometer. In the invention the potentiometer is replaced by a transistor, i.e. a current-controlled resistor, within the circuitry 26 of the AC high voltage source. To this transistor the rectified and filtered self-induction voltage over the primary winding is applied via an appropriately tuned amplifier circuit having a rectifier 27, a filter 28 and a controller 29. This provides for a control loop. Strictly speaking, the output voltage is kept constant instead of the output power in this basic design. If the output power is to be kept essentially constant, the pulse repetition rate of the voltage pulses 19 and 20 or the output voltage has to be adjusted to a varying load capacitance. Variable load capacitances occur due to different objects in front of the surface 15 of the dielectric barrier 3. There is a quadratically relation between the output power and the output voltage or the ignition voltage:

$$P=\tfrac{1}{2}\cdot C\cdot U^2\cdot f$$

I.e. small changes in the output voltage have a strong effect on the output power. By means of a simultaneous adjustment of the pulse repetition rate, however, the influence of an output voltage change may be attenuated. The output voltage may be varied over a large area depending on the ratio of this increase of the pulse repetition rate and of the change of the output voltage.

A particular embodiment of the new device 1 constructed as a hand-held unit 16 may have the following technical data: The output voltage is controlled depending on the load at the output within a range of 5 to 35 kvolt (5 to 35 thousand volt). The load depends on an object arranged in front of the surface 15 of the dielectric barrier. At the same time, the pulse repetition rate changes in the opposite direction to the height of the pulse amplitude within a range of 500 to 2,000 Hz. With a maximum output amplitude of 35 kvolt, the pulse repetition rate has a maximum value of about 500 Hz. The maximum value of the pulse repetition rate of ca, 2,000 Hz is achieved with the minimum output amplitude of about 5 kvolt. For igniting a plasma over metal objects a much smaller ignition voltage is used than for igniting a plasma over wood, for example. With a fixed predetermined ignition voltage it is only possible to treat objects of one class of materials to which the device 1 is adjusted, as in case of a device 1 without controller. In case of the preferred devices 1 with controller, the ignition voltage is automatically adjusted to the material, i.e. the electrical capacitance and conductivity of the object to be treated. The ignition voltage may be surveyed by means of a LED at the backside of the casing 17, for example. When the LED glows, the output voltage is between 20 and 35 kvolt, this corresponds roughly to the voltage necessary for treating wooden surfaces. If the LED does not glow or another LED glows, the output voltage is about 5 to 20 kvolt which corresponds to the necessary voltage for treating metal surfaces.

LIST OF REFERENCE NUMERALS

1 device
2 electrode
3 dielectric barrier
4 high voltage lead
5 isolation
6 AC high voltage source
7 energy supply
8 edge
9 gas discharge
10 gas
11 plasma
12 surface
13 body
14 surface
15 surface
16 hand-held unit
17 casing
18 switch
19 voltage pulse
20 voltage pulse
21 sinter bronze
22 sealing mass
23 ceramic solid body
24 metal pin
25 ignition transformer
26 AC circuitry
27 rectifier
28 filter
29 controller

We claim:

1. A device for plasma treatment at atmospheric pressure, the device having:

an electrode, a dielectric barrier directly arranged in front of the electrode and covering a surface of the electrode, and an AC high voltage source for applying an AC high voltage to the electrode to bring about a dielectric barrier discharge in a gas at atmospheric pressure present in front of an outer surface of the dielectric barrier, in order to generate a plasma, wherein the device has no counter-electrode for the electrode with the dielectric barrier, wherein the electrode, at the surface of the electrode covered by the dielectric barrier, comprises a two-dimensional distribution of pointed tips pointing towards the gas present in front of the dielectric barrier, wherein the outer surface of the dielectric barrier in front of which the gas is present is smooth, and wherein the electrode is made of an electrically conductive powder which is located in a ceramic solid body providing the dielectric barrier.

2. The device according to claim 1, wherein the pointed tips of the electrode have a radius of curvature of less than 100 μm.

3. The device according to claim 2, wherein the pointed tips of the electrode have a radius of curvature of less than 10.0 μm.

4. The device of claim 1, wherein the AC high voltage source is designed so as to provide the AC high voltage with a voltage rise of at least 5,000 volt/μs.

5. The device of claim 1, wherein the AC high voltage source is designed so as to provide the AC high voltage with a voltage rise of at least 10,000 volt/μs.

6. The device of claim 1, wherein the AC high voltage source is designed so as to provide the AC high voltage as voltage pulses having a voltage rise period of up to 5 μs, a voltage pulse duration of less than 10 μs, and a voltage amplitude of 5,000 volt to 60,000 volt.

7. The device of claim 6, wherein the AC high voltage source is designed so as to provide the AC high voltage as voltage pulses having a voltage rise period of less than 3 μs, a voltage pulse duration of less than 6 μs, and a voltage amplitude of 5,000 volt to 40,000 volt.

8. The device of claim 6, wherein the AC high voltage source is designed so as to provide the AC high voltage as successive voltage pulses of alternating polarity.

9. The device of claim 8, wherein the AC high voltage source is designed so as to provide the successive voltage pulses as voltage pulse pairs of a repetition frequency of less than 10,000 Hz.

10. The device of claim 9, wherein the AC high voltage source is designed so as to provide the successive voltage pulses as voltage pulse pairs of a repetition frequency of less than 5,000 Hz.

11. The device of claim 1, wherein the device is designed as a accumulator-powered, hand-held unit.

12. The device of claim 1, wherein a controller of the AC high voltage source measures a feedback signal of a load at an output side of an ignition transformer of the AC high voltage source connected to the electrode to an input side of the ignition transformer and makes use of this feedback signal as an input value for controlling the output power of the AC high voltage source.

13. The device of claim 12, wherein the controller of the AC high voltage source keeps the output power of the AC high voltage source constant by varying at least one variable selected from an output voltage and a pulse repetition rate of the AC high voltage source.

14. A device for plasma treatment at atmospheric pressure, the device having:

an electrode, a dielectric barrier directly arranged in front of the electrode and covering a surface of the electrode, and an accumulator powered AC high voltage source for applying an AC high voltage to the electrode to bring about a dielectric barrier discharge in a gas at atmospheric pressure present in front of an outer surface of the dielectric barrier, in order to generate a plasma, wherein the AC high voltage source is designed so as to provide the AC high voltage as voltage pulse pairs of voltage pulses of alternating polarity at a repetition frequency of the voltage pulse pairs of less than 10,000 Hz and at a voltage amplitude of 5,000 volt to 60,000 volt, wherein the device has no counter-electrode for the electrode with the dielectric barrier, wherein the electrode, at the surface of the electrode covered by the dielectric barrier, comprises a two-dimensional distribution of pointed tips pointing towards the gas present in front of the dielectric barrier, wherein the outer surface of the dielectric barrier in front of which the gas is present is smooth, and wherein the electrode is made of an electrically conductive powder which is located in a ceramic solid body providing the dielectric barrier.

15. The device of claim 14, wherein a controller of the AC high voltage source measures a feedback signal of a load at an output side of an ignition transformer of the AC high voltage source connected to the electrode to an input side of the ignition transformer and makes use of this feedback signal as an input value for controlling the output power of the AC high voltage source.

16. The device of claim 15, wherein the controller of the AC high voltage source keeps the output power of the AC high voltage source constant by varying at least one variable selected from an output voltage and a pulse repetition rate of the AC high voltage source.

* * * * *